(12) United States Patent
 Cho

(10) Patent No.: US 9,190,119 B2
(45) Date of Patent: Nov. 17, 2015

(54) SEMICONDUCTOR DEVICES HAVING MULTI-CHANNEL REGIONS AND SEMICONDUCTOR SYSTEMS INCLUDING THE SAME

(71) Applicant: SK hynix Inc., Icheon-si Gyeonggi-do (KR)

(72) Inventor: Yong Deok Cho, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 82 days.

(21) Appl. No.: 14/177,382

(22) Filed: Feb. 11, 2014

(65) Prior Publication Data
 US 2015/0085596 A1    Mar. 26, 2015

(30) Foreign Application Priority Data

Sep. 24, 2013  (KR) .................. 10-2013-0113307

(51) Int. Cl.
 *G11C 5/14*    (2006.01)
(52) U.S. Cl.
 CPC ...................... *G11C 5/14* (2013.01)

(58) Field of Classification Search
 CPC ................................. G11C 5/147; G11C 5/14
 USPC .......................................... 365/226, 222, 194
 See application file for complete search history.

(56) References Cited

U.S. PATENT DOCUMENTS 4,668,878 A      5/1987 Wyss
 2013/0242683 A1*  9/2013 Tanuma et al. ............... 365/226

FOREIGN PATENT DOCUMENTS

KR        1020080073505 A      8/2008

* cited by examiner

*Primary Examiner* — Huan Hoang
 (74) *Attorney, Agent, or Firm* — William Park & Associates Ltd.

(57) ABSTRACT

The semiconductor device includes a first channel region suitable for including a first pad region and a first core region and receiving a first power signal through a first power line, a second channel region suitable for including a second pad region and a second core region and receiving the first power signal through a second power line, and a switch unit suitable for electrically disconnecting the second power line from a first power stabilization unit if a predetermined operation of the first channel region is performed and electrically disconnecting the first power line from the first power stabilization unit if the predetermined operation of the second channel region is performed.

26 Claims, 5 Drawing Sheets

SEMICONDUCTOR DEVICES HAVING MULTI-CHANNEL REGIONS AND SEMICONDUCTOR SYSTEMS INCLUDING THE SAME

CROSS-REFERENCE TO RELATED APPLICATION

The present application claims priority under 35 U.S.C. 119(a) to Korean Application No. 10-2013-0113307, filed on Sep. 24, 2013, in the Korean Intellectual Property Office, which is incorporated herein by reference in its entirety as set forth in full.

BACKGROUND

1. Technical Field

Embodiments of the present disclosure relate to semiconductor devices and semiconductor systems including the same and, more particularly, to semiconductor devices having multi-channel regions and semiconductor systems including the same.

2. Related Art

Recently, multi-channel semiconductor devices have been proposed to obtain a high speed and a high integration density. These multi-channel semiconductor devices may provide at least two channel regions with a broad bandwidth. Each channel region included in the multi-channel semiconductor devices may include a memory cell array, input/output (I/O) pads and control circuits to perform an independent operation. That is, each of the channel regions included in a multi-channel semiconductor device may operate as an independent semiconductor device that individually inputs or outputs address signals, command signals and data.

In general, the semiconductor devices receive a power supply voltage (VDD) signal and a ground voltage (VSS) signal from an external device to generate internal voltage signals used in operations of internal circuits constituting each of the semiconductor devices. The internal voltage signals for operating the internal circuits of the semiconductor devices may include a core voltage (VCORE) signal supplied to core regions including memory cells, a boost voltage (VPP) signal used to drive or overdrive word lines, and a back-bias voltage (VBB) signal applied to a bulk region (or a substrate) of NMOS transistors in the core region. The external voltage signals such as the power supply voltage (VDD) signal and the ground voltage (VSS) signal and the internal voltage signals such as the core voltage (VCORE) signal, the boost voltage (VPP) signal and the back-bias voltage (VBB) signal may be transmitted through power lines disposed in the semiconductor devices.

SUMMARY

According to an embodiment, a semiconductor device includes a first channel region suitable for including a first pad region and a first core region and suitable for receiving a first power signal through a first power line, a second channel region suitable for including a second pad region and a second core region and suitable for receiving the first power signal through a second power line, and a switch unit suitable for electrically disconnecting the second power line from a first power stabilization unit if a predetermined operation of the first channel region is performed and suitable for electrically disconnecting the first power line from the first power stabilization unit if the predetermined operation of the second channel region is performed.

According to an embodiment, a semiconductor device includes a first power line suitable for supplying a power signal to a first channel region, a second power line suitable for supplying the power signal to a second channel region, a first switching element suitable for electrically disconnecting the first power line from a power stabilization unit if a predetermined operation of the second channel region is performed, and a second switching element suitable for electrically disconnecting the second power line from the power stabilization unit if the predetermined operation of the first channel region is performed.

According to an embodiment, a semiconductor system includes a controller and a semiconductor device. The controller generates an external power signal, a first command signal, a second command signal, a first address signal and a second address signal. The semiconductor device includes a first channel region receiving the external power signal through a first power line, a second channel region receiving the external power signal through a second power line, and a switch unit. The switch unit electrically disconnects the second power line from a power stabilization unit if a predetermined operation of the first channel region is performed. Further, the switch unit electrically disconnects the first power line from the power stabilization unit if the predetermined operation of the second channel region is performed.

BRIEF DESCRIPTION OF THE DRAWINGS

Embodiments of the present invention will become more apparent in view of the attached drawings and accompanying detailed descriptions, in which.

DETAILED DESCRIPTION OF THE EMBODIMENTS

Various embodiments of the present invention will be described hereinafter with reference to the accompanying drawings. However, the embodiments described herein are for illustrative purposes only and are not intended to limit the scope of the present invention.

Figure 1:
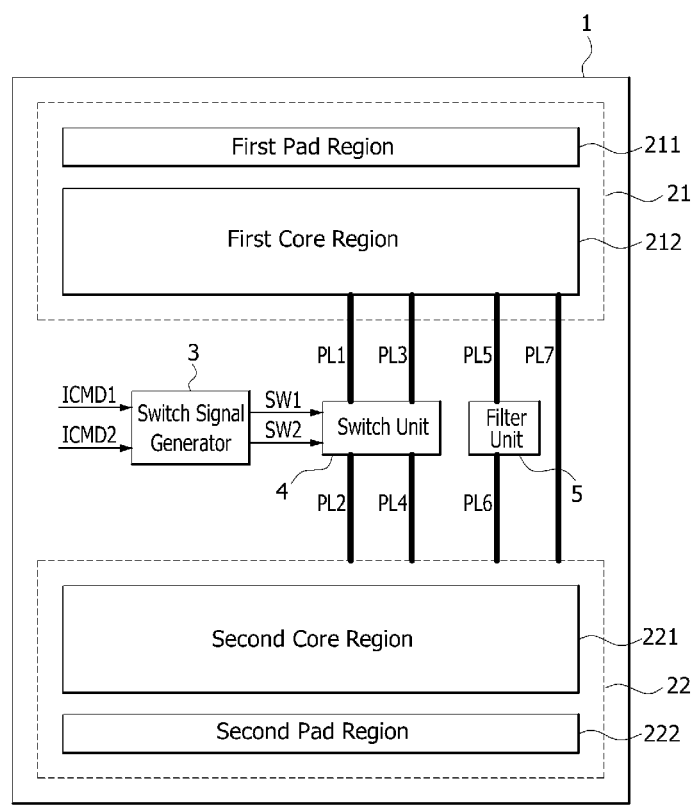
FIG. 1 is a block diagram illustrating a semiconductor device according to an embodiment of the present invention.

Referring to FIG. 1, a semiconductor device 1 may include a first channel region 21, a second channel region 22, a switch signal generator 3, a switch unit 4 and a filter unit 5. The first channel region 21 may include a first pad region 211 and a first core region 212. The second channel region 22 may include a second pad region 222 and a second core region 221.

The first pad region 211 may include a plurality of pads (not shown) to which first command signals, first address signals and first data are applied. The pad region 211 may include a structure of a conventional pad array. The first core region 212 may include a plurality of memory cells (not shown) which are accessed by the first command signals and the first address signals to store or output the first data. The memory cell may include a conventional switching device and a conventional memory member. The second pad region 222 may include a plurality of pads (not shown) to which second command signals, second address signals and second data are applied. The second core region 221 may include a plurality of memory cells (not shown) which are accessed by the second command signals and the second address signals to store or output the second data. Each of the first and second channel regions 21 and 22 may act as an independent semiconductor device that receives separate command signals and separate address signals to perform a data I/O operation. The first and second channel regions 21 and 22 may receive a ground voltage VSS signal supplied from an external device through a seventh power line PL7 in common.

The switch signal generator 3 may be suitable for receiving a first internal command signal ICMD1 and a second internal command signal ICMD2 and to generate a first switch signal SW1 and a second switch signal SW2 whose levels are set according to whether refresh operations of the first and second channel regions 21 and 22 are performed or not. The switch unit 4 may control an electrical connection between a first power line PL1 and a first power stabilization unit (not shown) in response to the first switch signal SW1. Further the switch unit 4 may control an electrical connection between a second power line PL2 and the first power stabilization unit in response to the second switch signal SW2. The first power line PL1 and the second power line PL2 may be electrically connected to the first channel region 21 and the second channel region 22, respectively. The first and second power lines PL1 and PL2 may transmit an external voltage signal therethrough. Further, the switch unit 4 may control an electrical connection between a third power line PL3 and a second power stabilization unit (not shown) in response to the first switch signal SW1. The switch unit 4 may control an electrical connection between a fourth power line PL4 and the second power stabilization unit in response to the second switch signal SW2. The third power line PL3 and the fourth power line PL4 may be electrically connected to the first channel region 21 and the second channel region 22, respectively. The third and fourth power lines PL3 and PL4 may transmit an internal voltage signal therethrough. The filter unit 5 may be electrically coupled between a fifth power line PL5 connected to the first channel region 21 and a sixth power line PL6 connected to the second channel region 22. An external voltage signal and an internal voltage signal, which is not used in the refresh operation, may be transmitted through the fifth and sixth power lines PL5 and PL6. The switch signal generator 3, the switch unit 4 and filter unit 5 may be arranged between the first channel region 21 and the second channel region 22.

Figure 2:
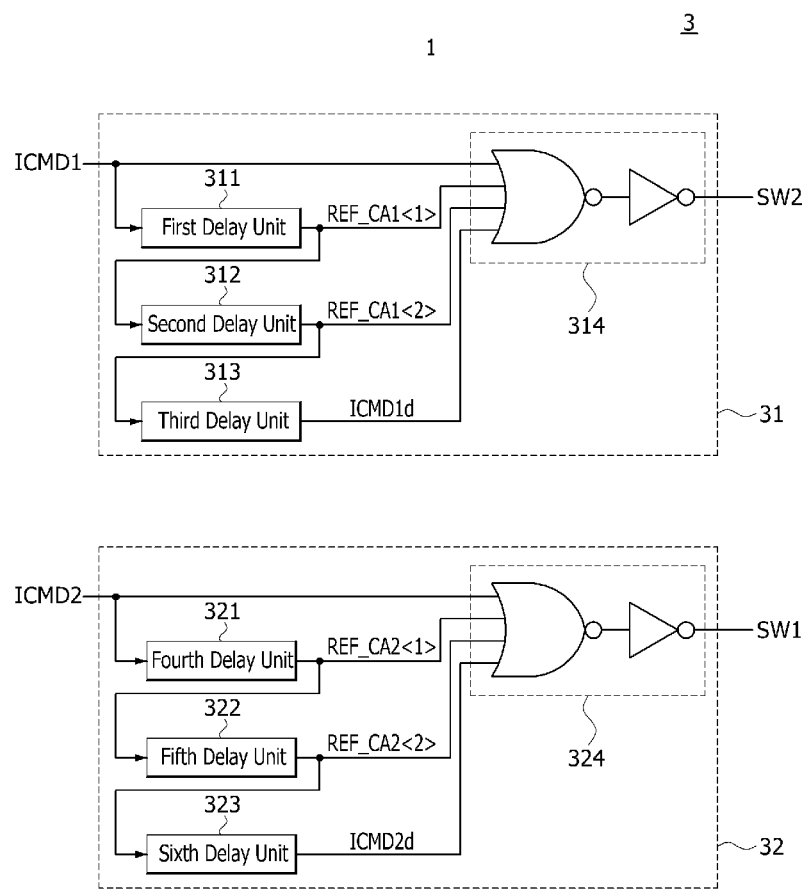
FIG. 2 is a block diagram illustrating a switch signal generator included in the semiconductor device of FIG. 1.

Referring to FIG. 2, the switch signal generator 3 may be suitable for including a first switch signal generator 31 and a second switch signal generator 32. The first switch signal generator 31 may include a first delay unit 311, a second delay unit 312, a third delay unit 313 and a first signal synthesizer 314. The second switch signal generator 32 may include a fourth delay unit 321, a fifth delay unit 322, a sixth delay unit 323 and a second signal synthesizer 324.

The first delay unit 311 may be suitable for retarding the first internal command signal ICMD1 by a first delay time to generate a first cell array refresh signal REF_CA1<1> for the first channel region (21 of FIG. 1). The second delay unit 312 may be suitable for retarding the first cell array refresh signal REF_CA1<1> by a second delay time to generate a second cell array refresh signal REF_CA1<2> for the first channel region (21 of FIG. 1). The third delay unit 313 may be suitable for retarding the second cell array refresh signal REF_CA1<2> by a third delay time to generate a first internal delay command signal ICMD1d. The first signal synthesizer 314 may be suitable for receiving the first internal command signal ICMD1, the first cell array refresh signal REF_CA1<1>, the second cell array refresh signal REF_CA1<2> and the first internal delay command signal ICMD1d, to generate the second switch signal SW2. The first signal synthesizer 314 may be suitable for outputting the second switch signal SW2 having a logic "high" level when at least one of the first internal command signal ICMD1, the first cell array refresh signal REF_CA1<1>, the second cell array refresh signal REF_CA1<2> and the first internal delay command signal ICMD1d has a logic "high" level. The first internal delay command signal ICMD1d may be generated to have a logic "high" level during a predetermined period when a refresh operation of the first channel region 21 is performed. The first and second cell array refresh signals REF_CA1<1:2> for the first channel region 21 may be generated to have a logic "high" level to perform the refresh operations of first and second cell arrays included in the first channel region 21.

The fourth delay unit 321 may be suitable for retarding the second internal command signal ICMD2 by a fourth delay time to generate a first cell array refresh signal REF_CA2<1> for the second channel region (22 of FIG. 1). The fifth delay unit 322 may be suitable for retarding the first cell array refresh signal REF_CA2<1> by a fifth delay time to generate a second cell array refresh signal REF_CA2<2> for the second channel region (22 of FIG. 1). The sixth delay unit 323 may be suitable for retarding the second cell array refresh signal REF_CA2<2> by a sixth delay time to generate a second internal delay command signal ICMD2d. The second signal synthesizer 324 may be suitable for receiving the second internal command signal ICMD2, the first cell array refresh signal REF_CA2<1>, the second cell array refresh signal REF_CA2<2> and second internal delay command signal ICMD2d and to generate the first switch signal SW1. The second signal synthesizer 324 may be suitable for outputting the first switch signal SW1 having a logic "high" level when at least one of the second internal command signal ICMD2, the first cell array refresh signal REF_CA2<1>, the second cell array refresh signal REF_CA2<2> and the second internal delay command signal ICMD2d has a logic "high" level. The second internal delay command signal ICMD2d may be generated to have a logic "high" level during a predetermined period when a refresh operation of the second channel region (22 of FIG. 1) is performed. The first and second cell array refresh signals REF_CA2<1:2> for the second channel region (22 of FIG. 1) may be generated to have a logic "high" level to perform refresh operations of first and second cell arrays included in the second channel region 22.

The first switch signal generator 31 may generate the second switch signal SW2 having a logic "high" level during a period from a starting timing of a refresh operation of the first channel region 21 until a timing that the third delay time elapses after termination of the refresh operations of the first and second cell arrays in the first channel region 21. The second switch signal generator 32 may generate the first switch signal SW1 having a logic "high" level during a period from a starting timing of a refresh operation of the second channel region 22 until a timing that the sixth delay time elapses after termination of the refresh operations of the first and second cell arrays in the second channel region 22. The first to sixth delay unit 311 to 323 may be a conventional delay, such as an inverter chain. The first and second signal synthesizer 314 and 324 may be logic gates, and suitable for performing "OR" operation.

Figure 3:
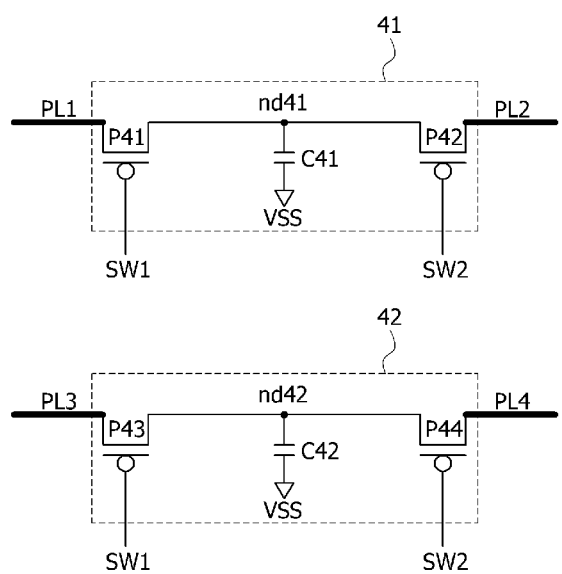
FIG. 3 is a circuit diagram illustrating a switch unit included in the semiconductor device of FIG. 1.

Referring to FIG. 3, the switch unit 4 may include a first switch unit 41 and a second switch unit 42. The first switch unit 41 may include a PMOS transistor P41, a PMOS transistor P42 and a capacitor C41. The PMOS transistor P41 may be electrically coupled between the first power line PL1 and a node ND41 to act as a switching element that is turned on in response to the first switch signal SW1. The PMOS transistor P42 may be electrically coupled between the second power line PL2 and the node ND41 to act as a switching element that is turned on in response to the second switch signal SW2. The capacitor C41 may be electrically coupled between the node ND41 and a ground voltage VSS terminal to act as a power stabilization element that stabilizes the signals on the first and second power lines PL1 and PL2. The second switch unit 42 may include a PMOS transistor P43, a PMOS transistor P44 and a capacitor C42. The PMOS transistor P43 may be electrically coupled between the third power line PL3 and a node ND42 to act as a switching element that is turned on in response to the first switch signal SW1. The PMOS transistor P44 may be electrically coupled between the fourth power line PL4 and the node ND42 to act as a switching element that is turned on in response to the second switch signal SW2. The capacitor C42 may be electrically coupled between the node ND42 and the ground voltage VSS terminal to act as a power stabilization element that stabilizes the signals on the third and fourth power lines PL3 and PL4.

The PMOS transistor P42 of the first switch unit 41 may be turned off to electrically disconnect the second power line PL2 from the capacitor C41 while the second switch signal SW2 is driven to have a logic "high" level by the refresh operation of the first channel region 21. The PMOS transistor P41 of the first switch unit 41 may be turned off to electrically disconnect the first power line PL1 from the capacitor C41 while the first switch signal SW1 is driven to have a logic "high" level by the refresh operation of the second channel region 22. The PMOS transistor P44 of the second switch unit 42 may be turned off to electrically disconnect the fourth power line PL4 from the capacitor C42 while the second switch signal SW2 is driven to have a logic "high" level by the refresh operation of the first channel region 21. The PMOS transistor P43 of the second switch unit 42 may be turned off to electrically disconnect the third power line PL3 from the capacitor C42 while the first switch signal SW1 is driven to have a logic "high" level by the refresh operation of the second channel region 22. At that time, the second switch signal SW2 may be used in an operation other than the refresh operation of the first and second channel region 21 and 22.

Figure 4:
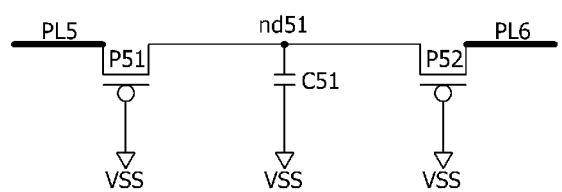
FIG. 4 is a circuit diagram illustrating a filter unit included in the semiconductor device of FIG. 1.

Referring to FIG. 4, the filter unit 5 may include a PMOS transistor P51, a PMOS transistor P52 and a capacitor C51. The PMOS transistor P51 may be electrically coupled between the fifth power line PL5 and a node ND51 to maintain a turn-on state in response to the ground voltage VSS signal. The PMOS transistor P52 may be electrically coupled between the sixth power line PL6 and the node ND51 to maintain a turn-on state in response to the ground voltage VSS signal. The capacitor C51 may be coupled between the node ND51 and the ground voltage VSS terminal to act as a power stabilization element that stabilizes the signals on the fifth and sixth power lines PL5 and PL6.

An operation of the semiconductor device 1 having the aforementioned configuration will be described hereinafter with reference to FIGS. 1 to 4 in conjunction with an example in which an refresh operation of the first channel region 21 is performed and an example in which an refresh operation of the second channel region 22 is performed.

When the refresh operation of the first channel region 21 is performed, the switch unit 4 may generate the second switch signal SW2 to have a logic "high" level. Thus, the second power line PL2 may be electrically disconnected from the capacitor C41 by turning off the PMOS transistor P42, and the fourth power line PL4 may be electrically disconnected from the capacitor C42 by turning off the PMOS transistor P44. As a result, no noises on the first power line PL1 and the third power line PL3 transmitting an external voltage signal and an internal voltage signal to the first channel region 21 are supplied to the second power line PL2 and the fourth power line PL4.

When the refresh operation of the second channel region 22 is performed, the switch unit 4 may generate the first switch signal SW1 to have a logic "high" level. Thus, the first power line PL1 may be electrically disconnected from the capacitor C41 by turning off the PMOS transistor P41, and the third power line PL3 may be electrically disconnected from the capacitor C42 by turning off the PMOS transistor P43. As a result, no noises on the second power line PL2 and the fourth power line PL4 transmitting the external voltage signal and the internal voltage signal to the second channel region 22 are supplied to the first power line PL1 and the third power line PL3.

Meanwhile, even though the refresh operations of the first and second channel regions 21 and 22 are concurrently performed, the fifth and sixth power lines PL5 and PL6 may be electrically connected to the capacitor C51. Thus, an external voltage signal or an internal voltage signal, which is not used in the refresh operation, may be stably supplied through the fifth and sixth power lines PL5 and PL6.

Although the above embodiment is described in conjunction with refresh operations that noises occur easily, the inventive concept may be equally applicable to any operations that noises easily occur on the power lines.

Figure 5:
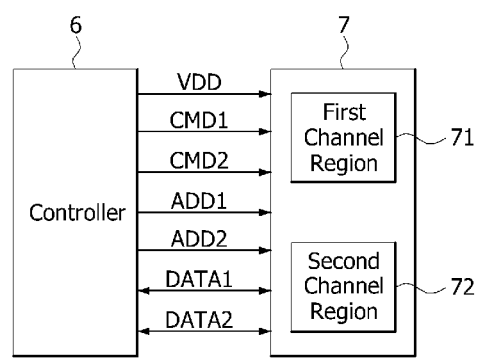
FIG. 5 is a block diagram illustrating a semiconductor system according to an embodiment of the present invention.

Referring to FIG. 5, a semiconductor system may include a controller 6 and a semiconductor device 7. The controller 6 may generate an external voltage VDD signal, a first command signal CMD1, a second command signal CMD2, a first address signal ADD1, a second address signal ADD2, a first data DATA1 and a second data DATA2 to apply them to the semiconductor device 7. The semiconductor device 7 may include a first channel region 71 and a second channel region 72. The first channel region 71 may include memory cells (not shown) accessed by the first command signal CMD1 and the first address signal ADD1 and may receive the first data DATA1 from the controller 6 or output the first data DATA1 to the controller 6. The second channel region 72 may include memory cells (not shown) accessed by the second command signal CMD2 and the second address signal ADD2 and may receive the second data DATA2 from the controller 6 or output the second data DATA2 to the controller 6. The semiconductor device 7 may receive the external voltage VDD signal to operate, and each of the first and second channel regions 71 and 72 may include power lines (not shown) for receiving the external voltage VDD signal. When a refresh operation is performed in the semiconductor device 7, noises may occur on the power lines that transmit the external voltage VDD signal to the first and second channel regions 71 and 72. However, the semiconductor device 7 may be designed such that no noises on the power lines connected to the first channel region 71 are transmitted to the second channel region 72 and no noises on the power lines connected to the second channel region 72 are transmitted to the first channel region 71, as described with reference to FIGS. 1 to 4. That is, the semiconductor device 7 may have substantially the same configuration as the semiconductor device 1 illustrated in FIGS. 1 to 4. Thus, a detailed description of the semiconductor device 7 will be omitted in the present application.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor device comprising:
a first channel region suitable for including a first pad region, a first core region and receiving a first power signal through a first power line;
a second channel region suitable for including a second pad region, a second core region and receiving the first power signal through a second power line; and
a switch unit suitable for electrically disconnecting the second power line from a first power stabilization unit if a predetermined operation of the first channel region is performed and electrically disconnecting the first power line from the first power stabilization unit if the predetermined operation of the second channel region is performed,
wherein the first pad region includes pads to which a first command signal and a first address signal are applied and pads through which first data are inputted or outputted, and
wherein the second pad region includes pads to which a second command signal and a second address signal are applied and pads through which second data are inputted or outputted.

2. The semiconductor device of claim 1,
wherein the first core region includes memory cells which are accessed by the first command signal and the first address signal to store the first data therein.

3. The semiconductor device of claim 2,
wherein the second core region includes memory cells which are accessed by the second command signal and the second address signal to store the second data therein.

4. The semiconductor device of claim 1, wherein the first power signal is an external power signal supplied from an external device or an internal power signal generated from the external power signal.

5. The semiconductor device of claim 1, wherein the predetermined operation is a refresh operation.

6. The semiconductor device of claim 1, wherein the switch unit includes:
a first switching element suitable for being electrically coupled between the first power line and the first power stabilization unit and being turned on in response to a first switch signal; and
a second switching element suitable for being electrically coupled between the second power line and the first power stabilization unit and being turned on in response to a second switch signal.

7. The semiconductor device of claim 6, wherein the first switch signal turns off the first switching element if the predetermined operation of the second channel region is performed.

8. The semiconductor device of claim 7, wherein the second switch signal turns off the second switching element if the predetermined operation of the first channel region is performed.

9. The semiconductor device of claim 1, further comprising a switch signal generator suitable for generating a second switch signal that electrically disconnects the second power line from the first power stabilization unit in response to a first internal command signal if the predetermined operation of the first channel region is performed and generating a first switch signal that electrically disconnects the first power line from the first power stabilization unit in response to a second internal command signal if the predetermined operation of the second channel region is performed.

10. The semiconductor device of claim 9, wherein the switch signal generator includes:
a first delay unit suitable for retarding the first internal command signal to generate a first cell array refresh signal for a refresh operation of a first cell array included in the first channel region;
a second delay unit suitable for retarding the first cell array refresh signal to generate a second cell array refresh signal for a refresh operation of a second cell array included in the first channel region;
a third delay unit suitable for retarding the second cell array refresh signal to generate a first internal delay command signal; and
a first signal synthesizer suitable for generating the second switch signal in response to the first and second cell array refresh signals and the first internal delay command signal.

11. The semiconductor device of claim 1,
wherein the first channel region further includes a third power line through which a second power signal is transmitted; and
wherein the second channel region further includes a fourth power line through which the second power signal is transmitted.

12. The semiconductor device of claim 11, wherein the second power signal is used in an operation other than the predetermined operation.

13. The semiconductor device of claim 11, further comprising:
a pair of switching elements serially electrically coupled between the third power line and the fourth power line; and
a second power stabilization unit electrically connected to a node between the pair of switching elements,
wherein the pair of switching elements are MOS transistors that are turned on in response to a bias voltage.

14. A semiconductor device comprising:
a first power line suitable for supplying a power signal to a first channel region;
a second power line suitable for supplying the power signal to a second channel region;
a first switching element suitable for electrically disconnecting the first power line from a power stabilization unit if a predetermined operation of the second channel region is performed; and
a second switching element suitable for electrically disconnecting the second power line from the power stabilization unit if the predetermined operation of the first channel region is performed,
wherein the first channel region includes a first pad region suitable for including pads to which a first command signal and a first address signal are applied and pads through which first data are inputted or outputted, and
wherein the second channel region includes a second pad region suitable for including pads to which a second command signal and a second address signal are applied and pads through which second data are inputted or outputted.

15. The semiconductor device of claim 14, wherein
a first core region suitable for including memory cells which are accessed by the first command signal and the first address signal to store the first data therein.

16. The semiconductor device of claim 15, wherein
a second core region suitable for including memory cells which are accessed by the second command signal and the second address signal to store the second data therein.

17. The semiconductor device of claim 14, wherein the power signal is an external power signal supplied from an external device or an internal power signal generated from the external power signal.

18. The semiconductor device of claim 14, wherein the predetermined operation is a refresh operation.

19. The semiconductor device of claim 14,
wherein the first switching element is turned off in response to a first switch signal if the predetermined operation of the second channel region is performed; and
wherein the second switching element is turned off in response to a second switch signal if the predetermined operation of the first channel region is performed.

20. A semiconductor system comprising:
a controller suitable for generating an external power signal, a first command signal, a second command signal, a first address signal and a second address signal; and
a semiconductor device suitable for including a first channel region receiving the external power signal through a first power line, a second channel region receiving the external power signal through a second power line, and a switch unit,
wherein the switch unit is suitable for electrically disconnecting the second power line from a power stabilization unit if a predetermined operation of the first channel region is performed and is suitable for electrically disconnecting the first power line from the power stabilization unit if the predetermined operation of the second channel region is performed,
wherein the first channel region includes a first pad region suitable for including pads to which the first command signal and the first address signal are applied and pads through which first data are inputted or outputted, and
wherein the second channel region includes a second pad region suitable for including pads to which the second command signal and the second address signal are applied and pads through which second data are inputted or outputted.

21. The semiconductor system of claim 20, wherein
a first core region suitable for including memory cells which are accessed by the first command signal and the first address signal to store the first data therein.

22. The semiconductor system of claim 21, wherein
a second core region suitable for including memory cells which are accessed by the second command signal and the second address signal to store the second data therein.

23. The semiconductor system of claim 20, wherein the predetermined operation is a refresh operation.

24. The semiconductor system of claim 20, wherein the switch unit includes:
a first switching element suitable for being electrically coupled between the first power line and the power stabilization unit and being turned on in response to a first switch signal; and
a second switching element suitable for being electrically coupled between the second power line and the power stabilization unit and being turned on in response to a second switch signal.

25. The semiconductor system of claim 24, wherein the first switch signal turns off the first switching element if the predetermined operation of the second channel region is performed.

26. The semiconductor system of claim 25, wherein the second switch signal turns off the second switching element if the predetermined operation of the first channel region is performed.

* * * * *